United States Patent
Kwon

(10) Patent No.: US 9,627,637 B2
(45) Date of Patent: Apr. 18, 2017

(54) FLEXIBLE DISPLAY DEVICE HAVING A FLEXIBLE PANEL WITH A BENDING PORTION AND MANUFACTURING METHOD THEREOF

(71) Applicant: SAMSUNG DISPLAY CO., LTD., Yongin-si, Gyeonggi-do (KR)

(72) Inventor: Ohjune Kwon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/927,341

(22) Filed: Oct. 29, 2015

(65) Prior Publication Data

US 2016/0343964 A1    Nov. 24, 2016

(30) Foreign Application Priority Data

May 19, 2015   (KR) ........................ 10-2015-0069368

(51) Int. Cl.
| | |
|---|---|
| *H01L 27/15* | (2006.01) |
| *H01L 31/12* | (2006.01) |
| *H01L 33/00* | (2010.01) |
| *H01L 51/00* | (2006.01) |
| *H01L 51/56* | (2006.01) |

(52) U.S. Cl.
CPC .......... *H01L 51/0097* (2013.01); *H01L 51/56* (2013.01); *H01L 2251/5338* (2013.01)

(58) Field of Classification Search
CPC ......... H01L 2251/5338; H01L 2227/32; H01L 51/50; H01L 51/525; H01L 51/5253; H01L 27/32; H01L 27/3232; H01L 27/3237; H01L 27/3244
See application file for complete search history.

(56) References Cited

U.S. PATENT DOCUMENTS

| | | | |
|---|---|---|---|
| 9,203,050 B2 * | 12/2015 | Jeong | ...................... H01L 27/32 |
| 2005/0190531 A1 | 9/2005 | Gall et al. | |
| 2015/0024170 A1 | 1/2015 | Min et al. | |

FOREIGN PATENT DOCUMENTS

| | | |
|---|---|---|
| KR | 10-2006-0123597 A | 12/2006 |
| KR | 10-2013-0081340 A | 7/2013 |
| KR | 10-2015-0010036 A | 1/2015 |
| KR | 10-2015-0020895 A | 2/2015 |

* cited by examiner

*Primary Examiner* — Hoai V Pham
(74) *Attorney, Agent, or Firm* — Lewis Roca Rothgerber Christie LLP

(57) ABSTRACT

A flexible display device includes: a flexible panel having a bending portion that is configured to bend about a radius with respect to an inner peripheral surface of the bending portion, and a housing supporting the flexible panel. The bending portion has one or more recesses at the inner peripheral surface of the bending portion, and an entry width of each of the recesses, a number of the recesses, and a thickness of the flexible panel meet the relation equation of $\pi d = nG$, where G denotes the entry width of each of the recesses, n denotes the number of the recesses, and d denotes the thickness of the flexible panel.

18 Claims, 3 Drawing Sheets

FLEXIBLE DISPLAY DEVICE HAVING A FLEXIBLE PANEL WITH A BENDING PORTION AND MANUFACTURING METHOD THEREOF

CROSS-REFERENCE TO RELATED APPLICATION

This application claims priority to, and the benefit of, Korean Patent Application No. 10-2015-0069368, filed on May 19, 2015, in the Korean Intellectual Property Office, the disclosure of which is incorporated herein in its entirety by reference.

BACKGROUND

1. Field

One or more exemplary embodiments relate to a flexible display device and a manufacturing method thereof.

2. Description of the Related Art

Generally, a flexible display device has a panel that adds flexibility to the flexible display device by forming a device layer for producing an image on a flexible substrate, and has a very useful aspect of bending the panel at an appropriate curvature and using the flexible display device as desired.

SUMMARY

One or more exemplary embodiments include a flexible display device and a manufacturing method thereof.

Additional aspects are set forth in part in the description which follows and, in part, will be apparent from the description, or may be learned by practice of the presented embodiments.

According to one or more exemplary embodiments, a flexible display device includes: a flexible panel having a bending portion bent about a radius an inner peripheral surface, and a housing for supporting the flexible panel, wherein the bending portion defines one or more recesses at the inner peripheral surface, wherein an entry width of each of the recesses, a number of the recesses, and a thickness of the flexible panel meet the following relation equation: $\pi d=nG$, and wherein G denotes the entry width of each of the recesses when the bending portion is unbent, n denotes the number of the recesses, and d denotes a thickness of the flexible panel.

Compression stress may be applied to the inner peripheral surface of the bending portion, and tensile stress may be applied to an outer peripheral surface of the bending portion that is opposite to the inner peripheral surface.

When the bending portion is unbent, a width of each of the recesses may be largest at the entry width, and may have a gradually narrow toward an inside of the flexible panel away from the inner peripheral surface.

When the bending portion is unbent, a cross-section of each of the recesses may be shaped as an isosceles triangle shape and have a bottom side corresponding to the entry width, two legs, and a vertex angle between the two legs.

When the bending portion is unbent, the vertex angle of each of the recesses may meet the following relation equation: $\tan \theta = \pi/2n$, wherein $\theta$ denotes the vertex angle divided by 2.

The flexible panel may include a flexible substrate and a device layer on the flexible substrate.

The flexible display device may further include: an adhesive layer, and an inorganic layer between the flexible substrate and the device layer.

The device layer, the adhesive layer, and the inorganic layer may be collectively thinner than the flexible substrate.

The bending portion may have a semicircular shape at the inner peripheral surface.

According to one or more exemplary embodiments, a method of manufacturing a flexible display device includes: preparing a flexible panel having a bending portion with an inner peripheral surface that is configured to bend about a radius; preparing one or more recesses defined by the inner peripheral surface; bending the bending portion to have the radius with respect to the inner peripheral surface; and installing the flexible panel on a housing, wherein the recesses correspond to the following relation equation: $\pi d=nG$, wherein d denotes a thickness of the flexible panel, G denotes an entry width of each of the recesses, and n denotes a number of the recesses.

Bending the bend portion may include applying compression stress to the inner peripheral surface; and applying tensile stress to an outer peripheral surface of the bending portion that is opposite to the inner peripheral surface.

Before bending the bending portion, a width of each of the recesses may be greatest at the entry width, and gradually narrow toward an inside of the flexible panel away from the inner peripheral surface.

Before bending the bending portion, a cross-section of each of the recesses may have an isosceles triangle shape having a bottom side corresponding to the entry width, two legs, and a vertex angle between the two legs.

The vertex angle may correspond to the following relation equation: $\tan \theta = \pi/2n$, wherein $\theta$ denotes the vertex angle divided by 2.

Preparing the flexible panel may include preparing a flexible substrate and preparing a device layer on the flexible substrate.

Preparing the flexible panel may further include preparing an adhesive layer and preparing an inorganic layer between the flexible substrate and the device layer.

The device layer, the adhesive layer, and the inorganic layer may be collectively thinner than the flexible substrate.

The bending portion may have a semicircular shape at the inner peripheral surface after bending the bending portion.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION

Figure 1:
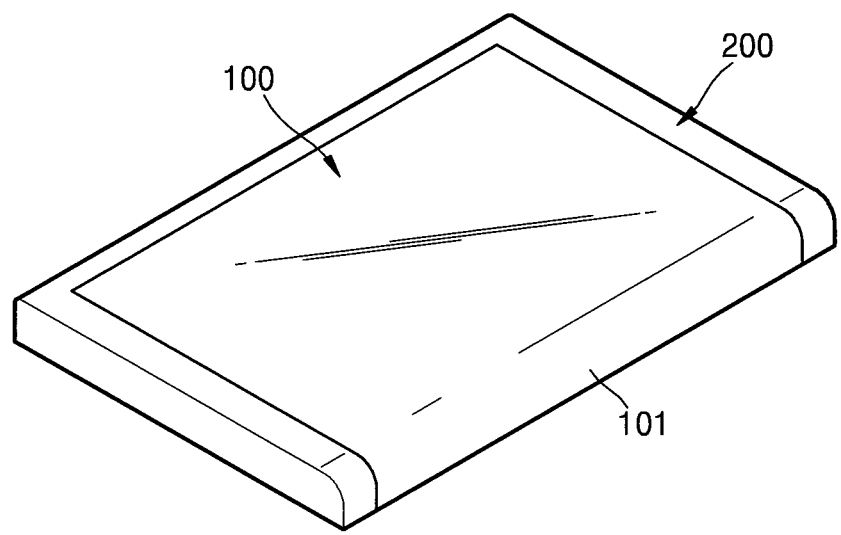
FIG. 1 is a perspective view illustrating a flexible display device according to one or more exemplary embodiments of the present invention.

As the inventive concept allows for various changes and numerous embodiments, exemplary embodiments are illustrated in the drawings and described in detail. An effect and a characteristic of the inventive concept, and a method for accomplishing these will be apparent when exemplary embodiments described below in detail are referred to together with the drawings. However, the inventive concept is not limited to the exemplary embodiments described below and may be implemented in various forms.

Hereinafter, exemplary embodiments are described in detail with reference to the accompanying drawings. Like reference numerals are used for like or corresponding elements, and repeated description thereof may be omitted.

As used herein, the singular forms "a," "an" and "the" are intended to include the plural forms as well, unless the context clearly indicates otherwise.

It will be further understood that the terms "comprises," "comprising," "includes" and/or "including" used herein specify the presence of stated features or components, but do not preclude the presence or addition of one or more other features or components. As used herein, the term "and/or" includes any and all combinations of one or more of the associated listed items. Expressions such as "at least one of," when preceding a list of elements, modify the entire list of elements and do not modify the individual elements of the list.

It will be understood that when a layer, region, or component is referred to as being formed "on" or "connected to" another layer, region, or component, it can be directly or indirectly formed on or connected to the other layer, region, or component. That is, for example, intervening layers, regions, or components may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Sizes of elements in the drawings may be exaggerated for convenience of explanation. In other words, because sizes and thicknesses of components in the drawings are arbitrarily illustrated for convenience of explanation, the following embodiments are not limited thereto.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

When a certain embodiment may be implemented differently, a specific process order may be performed differently from the described order. For example, two consecutively described processes may be performed substantially at the same time, or may be performed in an order opposite to the described order.

FIG. 1 illustrates a flexible display device according to one or more exemplary embodiments of the present invention.

As illustrated, the flexible display device may be formed in a structure where a flexible panel 100 is supported by a housing 200.

Also, an end portion of the flexible panel 100 may be bent/curved at, or along, a bending portion 101, so that the end portion of the flexible panel 100 may be seen from a lateral side of the housing 200.

Figure 2:
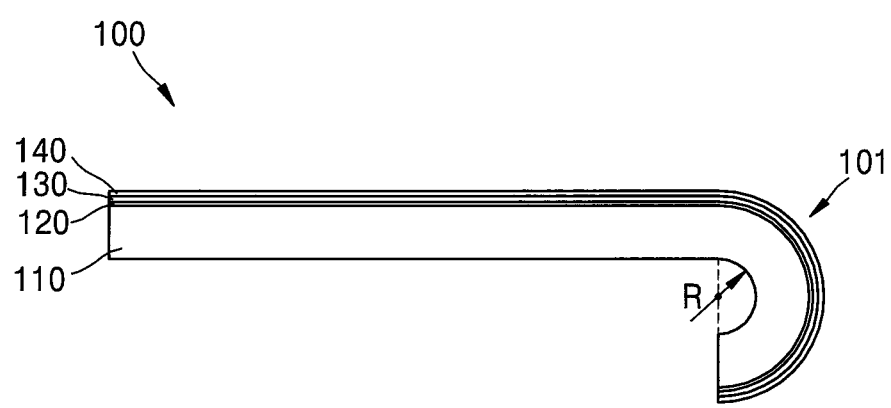
FIG. 2 is a perspective view of a flexible panel of the flexible display device of FIG. 1.

FIG. 2 is a cross-sectional view of the flexible panel 100. Because a flexible substrate 110 is used, the flexible panel 100 may be freely bent within an allowed range of flexibility thereof, and thus the bending portion 101 may be bent with (or about) a radius R, as illustrated in FIG. 2.

Also, an inorganic layer 130, which is a protection layer, is formed on the flexible substrate 110 with an adhesive layer 120 therebetween, and a device layer 140 for producing an image is formed on the inorganic layer 130. Here, because the adhesive layer 120, the inorganic layer 130, and the device layer 140 are thin film layers that are relatively thin when compared to the flexible substrate 110, a thickness of the flexible panel 100 (e.g., a total thickness of the flexible panel 100) is only slightly more than the thickness of the flexible substrate 110. Although the adhesive layer 120, the inorganic layer 130, and the device layer 140 only slightly add to the thickness of the flexible substrate 110, the added thickness is negligible when a recess 111 (see FIG. 3A), which is described later, is formed at a lateral side of an inner peripheral surface (or an inner peripheral side) of the bending portion 101 of the flexible panel 100, so that herein, the thickness of the flexible panel 100 is understood as the thickness of the flexible substrate 110.

The recess 111 may be defined in (or formed in) the lateral side of the inner peripheral surface of the bending portion 101 of the flexible panel 100. A method of forming the recess 111 is described below, although the inner structure of the device layer 140 is briefly described first.

Figure 4:
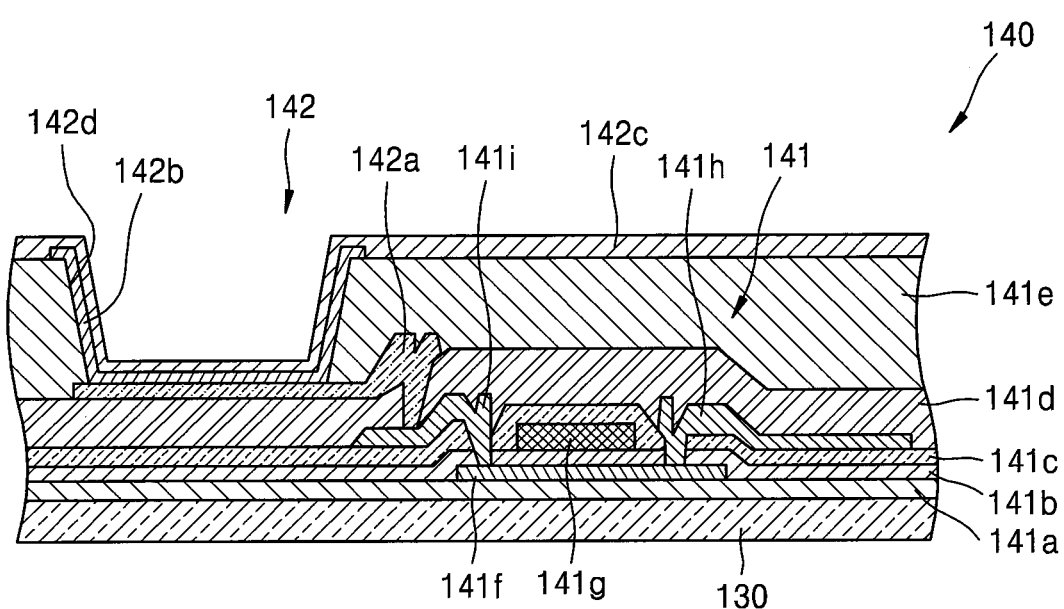
FIG. 4 is a cross-sectional view illustrating a device layer of the flexible panel of FIG. 2.

FIG. 4 is a cross-sectional view illustrating a device layer of the flexible panel of FIG. 2.

Referring to FIG. 4, in the present embodiment, a thin film transistor (TFT) 141, an electroluminescence (EL) device 142, etc. are provided on the flexible panel 100 (e.g., at an inside of the flexible panel 100). In detail, an active layer 141f is formed on an upper portion of a buffer layer 141a that is on the inorganic layer 130. The active layer 141f has a source region and a drain region doped with N-type or P-type impurities of high concentration. The active layer 141f may be formed of an oxide semiconductor. For example, an oxide semiconductor of the active layer 141f may include an oxide of a material selected from group 12, 13, and 14 metallic elements, such as Zn, In, Ga, Sn, Cd, Ge, or Hf, and/or a combination thereof. For example, the active layer 141f may include G-I-Z-O [$(In_2O_3)a(Ga_2O_3)b(ZnO)c$] (where a, b, and c are real numbers meeting the conditions of a≥0, b≥0, and c≥0, respectively). A gate electrode 141g is formed at an upper portion of the active layer 141f with a gate insulating layer 141b therebetween. A source electrode 141h and a drain electrode 141i are formed at an upper portion of the active layer 141f adjacent the gate electrode 141g. An interlayer insulating layer 141c is between the gate electrode 141g, the source electrode 141h, and the drain electrode 141i. A passivation layer 141d is between the source electrode 141h, the drain electrode 141i, and an anode electrode 142a of the EL device 142.

An insulating planarization layer 141e may be formed by acryl, etc. at an upper portion of the anode electrode 142a and on the passivation layer 141d, and after a predetermined opening 142d is formed in the planarization layer 141e, a remainder of the EL device 142 is formed.

The EL device 142 is configured to display predetermined image information by emitting light of red, green, and blue colors depending on the flow of a current. The EL device 142 includes the anode electrode 142a, which is connected to the drain electrode 141i of the TFT 141 to receive a positive voltage from the drain electrode 141i, a cathode electrode 142c, which covers an entire pixel and is configured to supply a negative voltage, and an emission layer 142b, which is between the two electrodes 142a and 142c and is configured to emit light.

A hole injection layer (HIL), a hole transport layer (HTL), an electron transport layer (ETL), an electron injection layer (EIL), etc. may be stacked adjacent to the emission layer 142b.

For reference, the emission layer 142b may be separately formed for every pixel so that the pixels that emit light of red, green, and blue colors may collectively form one unit pixel. Alternatively, the emission layer 142b may be formed in common over an entire pixel region regardless of the position of the pixel. The emission layer may be formed by, for example, vertically stacking or combining layers including a light-emitting material that emits light of red, green, and blue colors. A combination of other colors is possible if some combination thereof may emit white light. Also, the emission layer 142b may further include a color conversion layer or a color filter for converting the emitted white light to light of a predetermined color.

The emission layer 142b may be vulnerable to moisture, but may be substantially protected from moisture by forming a thin film encapsulation layer in which an organic layer and an inorganic layer are alternately stacked on the cathode electrode 142c, for example.

When the bending portion 101 of the flexible panel 100 is bent with the radius R, compression stress is applied to the inner peripheral surface of the bending portion 101, and tensile stress is applied to an outer peripheral surface (or an outer peripheral side) that is opposite to the inner peripheral surface. Also, a neutral portion, to which neither compression stress nor tensile stress is applied, exists at a position therebetween, and the device layer 140 including wirings for producing an image is designed to be at or close to the neutral portion, so that the device layer 140 including the wirings is protected or substantially protected from the compression stress and from the tensile stress.

Figure 3A:
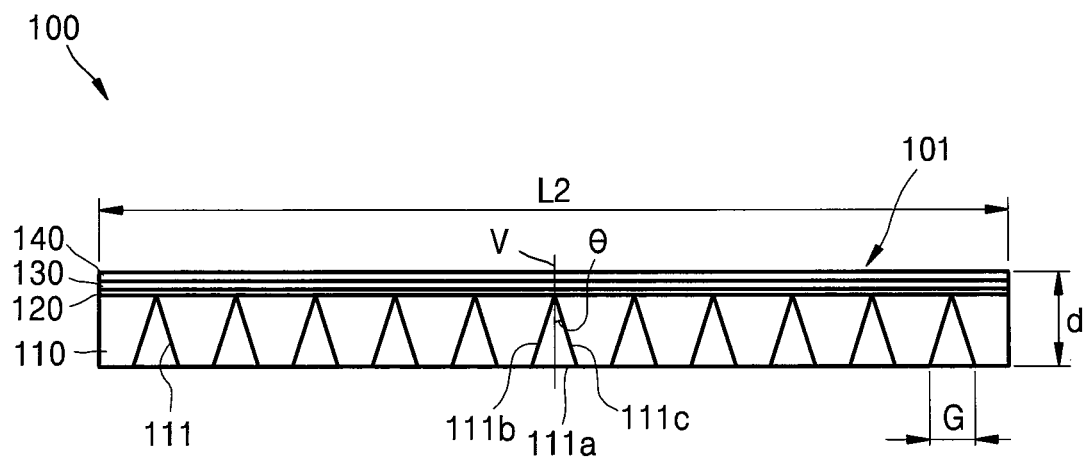
FIGS. 3A and 3B are cross-sectional views illustrating a bending portion of the flexible panel illustrated in FIG. 2 in an unfolded configuration and a folded configuration, respectively.

However, when the bending portion 101 is bent with the radius R, as illustrated in FIG. 2, but omits the recess 111 of FIG. 3A, the inner peripheral surface does not form a smooth circular shape about the radius R, but is instead crushed and deformed (e.g., wrinkled) by compression stress, so that the position of the neutral portion is not consistently maintained at an expected position, but instead changes (or varies). When this occurs, the device layer 140 may be damaged. However, the flexible display device 100 according to one or more exemplary embodiments of the present invention may prevent or reduce the likelihood of damaging the device layer 140 by defining the recess 111 in the flexible substrate 110 at the inner peripheral surface of the bending portion 101, as illustrated in FIGS. 3A and 3B.

Figure 3B:
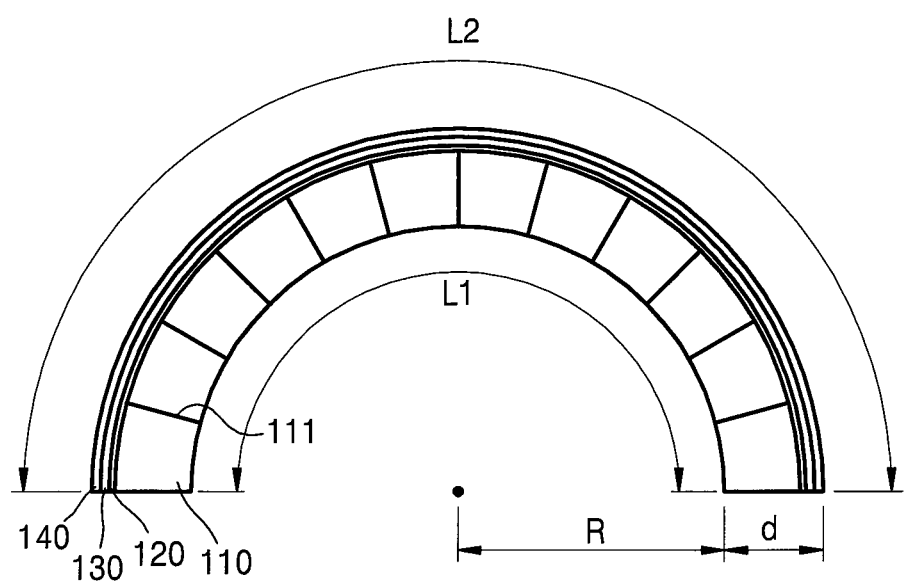

FIG. 3A illustrates the bending portion 101 of the flexible panel 110 in an unfolded configuration, and FIG. 3B illustrates the bending portion 101 in a bent configuration about the radius R with respect to the inner peripheral surface of FIG. 2.

First, referring to FIG. 3A, a plurality of recesses 111 are defined at a portion of the flexible substrate 110 corresponding to the bending portion 101. The recesses 111 have a shape having a relatively large entry width G, and having a width that narrows toward the inside of the flexible panel 100. In the present embodiment, the recesses 111 are formed to have an isosceles triangular shape having a pair of legs (or sides) 111b and 111c that are symmetrical with each other, having the entry width G as a bottom side (or base) 111a, and a vertex angle opposite to the bottom side 111a. In other words, when an imaginary perpendicular line V is drawn from a vertex where the legs 111b and 111c of one of the recesses 111 meet (e.g., from the vertex angle) to the bottom side 111a (e.g., an imaginary line V that bisects the vertex angle and extends to a midpoint of the bottom side 111a), an angle between (or formed by) the perpendicular line V and each of the legs 111b and 111c is θ. In other words, θ corresponds to one half of the vertex angle, or 2θ equals the vertex angle.

In addition, a thickness d of the flexible panel 100 may be substantially equal to the thickness of the flexible substrate 110. That is, although thicknesses of the thin film layers 120, 130, 140 on the flexible substrate 110 are exaggerated in the figures for clarity, the thickness of the flexible substrate 110 may occupy a majority of the thickness of the flexible panel 100 in practice. Though it is more accurate to calculate the thickness in consideration of all of the thin film layers 120, 130, 140 of the flexible panel 100 in addition to the flexible substrate 110, an error is negligible (or ignorable) even when the thickness of the flexible substrate 110 is understood as the thickness of the flexible panel 100, so that the thickness of the flexible panel 100 may be approximated (or replaced) by the thickness of the flexible substrate 110 for convenience (e.g., for calculation or application).

When the bending portion 101 of the flexible panel 100 is bent about the radius R with respect to the inner peripheral surface, a bent configuration as illustrated in FIG. 3B is obtained, and an entry of each of the recesses 111 (e.g., an entry corresponding to the bottom side 111a) is closed by compression of the inner peripheral surface. At this point, when the size and the number of the recesses 111 are accurately provided, the entry of each of the recesses 111 may be closed (or substantially closed), and the inner peripheral surface is not further compressed, and is thus not crushed when the bending portion 101 is bent to have the radius R, as described above. That is, a smooth semicircular shape at the inner peripheral surface may be formed, and deformation of the neutral portion by compression deformation, etc. may be substantially prevented, as described above. The appropriate condition may be found according to a relation equation, described below.

First, defining an inner peripheral length of a semicircle on an inner peripheral side with a radius R as L1, and defining an outer peripheral length of the semicircle on an outer peripheral side (e.g., the side opposite to the inner peripheral side) as L2 (see FIG. 3B), the relation equation (1) $L1=\pi R$, (2) $L2=\pi(R+d)$ is established, where $\pi$ is the constant of a circle. Here, L2 corresponds to the length of a side where the recesses 111 do not exist (or extend to or into) when the bending portion 101 is unfolded, as illustrated in FIG. 3A, while L1 corresponds to a value obtained by subtracting a sum of the entry widths G of each of the recesses 111 from L2, as expressed by the relation equation (3) $L1=L2-nG$, where n is the number of recesses 111. When relation equations (1) and (2) are input into relation equation (3), the relation equation (4) $\pi d=nG$ is derived.

That is, one or more recesses 111 are formed in the flexible substrate 110, and when the recesses 111 are formed such that the sum of the entry widths G of all the recesses 111 is equal to $\pi$ multiplied by the thickness d of the flexible panel 100 (i.e., when $\pi d=nG$), the inner peripheral surface forms a smooth semicircle when the bending portion is bent with the radius R, so that the neutral portion may be stably maintained.

Consequently, when the number n of the recesses 111 and the entry width G of each of the recesses 111 are formed such that the relation equation (4) of $\pi d=nG$ is met, a semicircle whose inner peripheral surface is smooth is formed when the bending portion is bent with the radius R. As such, deformation (e.g., unexpected deformation) of the bending portion may be prevented or reduced, and thus the neutral portion may be maintained stably or substantially stably at a set position when the flexible panel 100 is in a bent configuration.

Meanwhile, how the vertical angle of each isosceles triangle-shaped recess 111 should be formed may be considered, which may be derived by using a relation equation described below.

First, as described above with reference to FIG. 3A, assuming that when the imaginary perpendicular line V is drawn from the vertex, where the pair of legs 111b and 111c of each recess 111 meet, to the bottom side 111a (which corresponds to the entry width G), the angle $\theta$ formed by the perpendicular line V and each of the legs 111b and 111c meets the relation equation (5) $d \tan\theta = G/2$, where d denotes the depth of the recess 111 and G denotes the entry width of each recess 111. In other words, the angle $\theta$ corresponds to the vertex angle divided by two. The recess 111 is formed to correspond to the thickness of the flexible substrate 110, and an error is negligible (or ignorable) even when the thickness of the flexible substrate 110 is understood as the thickness d of the flexible panel 100, so that the depth d of the recess 111 is calculated as the thickness d of the flexible panel 100 or the thickness of the flexible substrate 110.

When relation equation (5) is input to relation equation (4), relation equation (6) $\tan\theta = \pi/2n$ is derived.

Therefore, when the number n of recesses 111 and the width G of the recesses 111 are determined via relation equation (4), subsequently, the inner angle $\theta$ of the recess 111 may be determined via relation equation (6).

By doing this, a smooth semicircular shape may be formed when the bending portion 101 of the flexible panel 100 is bent with the radius R, and the neutral portion may be stably maintained, so that a display device may be reliable.

Meanwhile, though embodiments having an organic light-emitting display device where the device layer 140 has the EL device 142 have been exemplified, exemplary embodiments are not limited thereto, but are instead applicable to all flexible display devices that may be bent with the radius R.

Therefore, according to the flexible display device and the manufacturing/design method thereof described above, the appropriate number and the shape of recesses may be formed in the inner peripheral surface of the bending portion, and deformation (e.g., unexpected deformation) may be prevented or reduced, so that the neutral portion may be stably maintained at a set position under a bent configuration, and thus reliability of a product may improve.

While one or more exemplary embodiments have been described with reference to the figures, it will be understood by those of ordinary skill in the art that various changes in form and details may be made therein without departing from the spirit and scope as defined by the following claims, and their equivalents.

What is claimed is:

1. A flexible display device comprising:
   a flexible panel having a bending portion bent about a radius at an inner peripheral surface; and
   a housing supporting the flexible panel,
   wherein the bending portion defines one or more recesses at the inner peripheral surface,
   wherein an entry width of each of the recesses, a number of the recesses, and a thickness of the flexible panel meet the following relation equation:

$\pi d=nG$, and wherein G denotes the entry width of each of the recesses when the bending portion is unbent, n denotes the number of the recesses, and d denotes the thickness of the flexible panel.

2. The flexible display device of claim 1, wherein compression stress is applied to the inner peripheral surface of the bending portion, and tensile stress is applied to an outer peripheral surface of the bending portion that is opposite to the inner peripheral surface.

3. The flexible display device of claim 1, wherein, when the bending portion is unbent, a width of each of the recesses is largest at the entry width, and gradually narrows toward an inside of the flexible panel away from the inner peripheral surface.

4. The flexible display device of claim 3, wherein, when the bending portion is unbent, a cross-section of each of the recesses is shaped as an isosceles triangle shape and have a bottom side corresponding to the entry width, two legs, and a vertex angle between the two legs.

5. The flexible display device of claim 4, wherein, when the bending portion is unbent, the vertex angle of each of the recesses meets the following relation equation:

$$\tan\theta = \pi/2n,$$

wherein $\theta$ denotes the vertex angle divided by 2.

6. The flexible display device of claim 1, wherein the flexible panel comprises:
a flexible substrate; and
a device layer on the flexible substrate.

7. The flexible display device of claim 6, further comprising:
an adhesive layer; and
an inorganic layer between the flexible substrate and the device layer.

8. The flexible display device of claim 7, wherein the device layer, the adhesive layer, and the inorganic layer are collectively thinner than the flexible substrate.

9. The flexible display device of claim 1, wherein the bending portion has a semicircular shape at the inner peripheral surface.

10. A method of manufacturing a flexible display device, the method comprising:
preparing a flexible panel having a bending portion with an inner peripheral surface that is configured to bend about a radius;
preparing one or more recesses defined by the inner peripheral surface;
bending the bending portion to have the radius with respect to the inner peripheral surface; and
installing the flexible panel on a housing,
wherein the recesses correspond to the following relation equation:

$$\pi d = nG,$$

wherein d denotes a thickness of the flexible panel, G denotes an entry width of each of the recesses, and n denotes a number of the recesses.

11. The method of claim 10, wherein bending the bending portion comprises:
applying compression stress to the inner peripheral surface; and
applying tensile stress to an outer peripheral surface of the bending portion that is opposite to the inner peripheral surface.

12. The method of claim 10, wherein, before bending the bending portion, a width of each of the recesses is greatest at the entry width, and gradually narrows toward an inside of the flexible panel away from the inner peripheral surface.

13. The method of claim 12, wherein, before bending the bending portion, a cross-section of each of the recesses has an isosceles triangle shape having a bottom side corresponding to the entry width, two legs, and a vertex angle between the two legs.

14. The method of claim 13, wherein the vertex angle corresponds to the following relation equation:

$$\tan\theta = \pi/2n,$$

wherein $\theta$ denotes the vertex angle divided by 2.

15. The method of claim 10, wherein preparing the flexible panel comprises:
preparing a flexible substrate; and
preparing a device layer on the flexible substrate.

16. The method of claim 15, wherein preparing the flexible panel further comprises:
preparing an adhesive layer; and
preparing an inorganic layer between the flexible substrate and the device layer.

17. The method of claim 16, wherein the device layer, the adhesive layer, and the inorganic layer are collectively thinner than the flexible substrate.

18. The method of claim 10, wherein the bending portion has a semicircular shape at the inner peripheral surface after bending the bending portion.

* * * * *